US007613014B2

(12) United States Patent
Tokumoto

(10) Patent No.: US 7,613,014 B2
(45) Date of Patent: Nov. 3, 2009

(54) SWITCH MOUNTING MECHANISM IN FLUID PRESSURE DEVICE

(75) Inventor: Shioto Tokumoto, Tsukubamirai (JP)

(73) Assignee: SMC Corporation, Chiyoda-ku, Tokyo (JP)

( * ) Notice: Subject to any disclaimer, the term of this patent is extended or adjusted under 35 U.S.C. 154(b) by 0 days.

(21) Appl. No.: 12/290,824

(22) Filed: Nov. 4, 2008

(65) Prior Publication Data

US 2009/0122511 A1 May 14, 2009

(51) Int. Cl.
*H05K 7/10* (2006.01)

(52) U.S. Cl. ....................... 361/837; 361/828; 361/631; 361/643; 361/628

(58) Field of Classification Search ................. 361/605, 361/628, 630, 632, 828, 833, 835, 837, 631, 361/643; 335/162, 202; 200/50.02, 215
See application file for complete search history.

(56) References Cited

U.S. PATENT DOCUMENTS 4,578,660 A * 3/1986 Hanada et al. .............. 335/133
6,577,495 B2 * 6/2003 West .......................... 361/626
6,985,065 B2 * 1/2006 Aguila ....................... 337/235

FOREIGN PATENT DOCUMENTS

DE 202005001764 U 5/2005
DE 102004001788 A 8/2005
JP H10-196610 A 7/1998

* cited by examiner

*Primary Examiner*—Dameon E Levi
(74) *Attorney, Agent, or Firm*—Yokoi & Co., U.S.A., Inc.; Peter Ganjian

(57) ABSTRACT

The present invention provides a switch mounting mechanism that can be adopted with ease in conjunction with a compact fluid pressure device. A space (31), to be used to absorb elastic deformation of a holding arm (33) occurring as a switch holder (24) is inserted through a groove opening (22A) of a switch mounting groove (22), is formed. A clearance (32) to be used as a buffer for the holding arm (33) is formed between the switch mounting groove (22) and a detection switch (21). As a result, the switch holder (24) can be inserted to assume the same position as the detection switch (21) inside the switch mounting groove (22).

3 Claims, 6 Drawing Sheets

(PROIR ART)

SWITCH MOUNTING MECHANISM IN FLUID PRESSURE DEVICE

TECHNICAL FIELD

The present invention relates to a switch mounting mechanism that may be adopted when mounting a detection switch that detects the operating position of a piston, a valve member or the like at a fluid pressure device such as a fluid pressure cylinder or an electromagnetic valve.

BACKGROUND ART

A fluid pressure device such as a fluid pressure cylinder or an electromagnetic valve assumes a structure that includes a detection switch used to detect the operating position of a piston, a valve member or the like, mounted in a switch mounting groove formed at a housing, so as to detect via the detection switch the magnetic field of a magnet installed in the piston, the valve member or the like.

Japanese Laid Open Patent Publication No. H10-196610 discloses a mechanism that may be adopted when mounting the detection switch at the housing of a fluid pressure cylinder. As shown in FIGS. 7 through 9, the switch mounting mechanism includes switch mounting grooves 2 formed at the housing 1, detection switches 3 assuming the shape of a rod, retainer screws 4 mounted at the detection switches 3 so as to advance/retreat freely and synthetic resin switch holders 5 each used to lock a detection switch 3 at a detection position within the corresponding switch mounting groove 2.

Each switch holder 5 in this switch mounting mechanism is pressed into the switch mounting groove 2 as the switch holder undergoes the process of elastic deformation through a groove opening 2*a* and is made to slide to a point close to the detection position. Then, the detection switch 3 is inserted in the switch mounting groove 2 at a position set apart from the switch holder 5 and the detection switch is made to slide to fit inside the switch holder 5. Next, the switch holder 5 and the detection switch 3 together are made to slide to the detection position. The retainer screw 4 is subsequently tightened until the front end of the retainer screw 4 is pressed in contact with the bottom of the switch mounting groove 2, thereby lifting up the detection switch 3. The switch holder 5 is pressed and held against groove walls 2*b* of the switch mounting groove 2 via the detection switch 3 in the lifted state and, as a result, the detection switch 3 is locked in place.

DISCLOSURE OF THE INVENTION

While the switch mounting mechanism in the known art described above allows a detection switch to be mounted easily and reliably at a fluid pressure device, there is still an issue to be addressed. Namely, there may be significant difficulty in mounting a detection switch at a fluid pressure device such as a compact fluid pressure cylinder with a small operating stroke, since the switch mounting groove cannot range over a sufficient length due to the smaller housing length. More specifically, if the length of the switch mounting groove is smaller than the sum of the switch holder length and the detection switch length and the switch mounting groove is closed off on both ends with end blocks or the like, the detection switch is bound to partially overlap the switch holder even with the switch holder having been inserted in the switch mounting groove, slid to the groove end position and thus, the detection switch cannot be inserted into the switch mounting groove. In short, the switch mounting mechanism in the related art is not ideal in applications in compact fluid pressure devices.

Accordingly, an object of the present invention is to provide a highly versatile switch mounting mechanism that can be adopted with ease in a compact fluid pressure device as well as in a regular size fluid pressure device.

The present invention achieves the object described above by providing a switch mounting mechanism comprising a switch mounting groove formed at a housing of a fluid pressure device, a rod-shaped detection switch installed at a detection position within the switch mounting groove, a retainer screw mounted at the detection switch, which lifts up the detection switch as it is tightened and a switch holder disposed inside the switch mounting groove so as to hold the detection switch from two sides with a pair of holding arms, made up with a left holding arm and a right holding arm. As the retainer screw is tightened and the detection switch is lifted, the holding arms of the switch holder become engaged with the detection switch and the switch mounting groove and the detection switch thus becomes locked at the detection position.

The switch mounting groove includes a groove opening that opens at an outer surface of the housing and a switch housing chamber located further into the groove relative to the groove opening. The groove opening is formed so that it opens over a width smaller than the chamber width of the switch housing chamber and a keeper portion to engage with the switch holder is formed at the boundary between the groove opening and the switch housing chamber.

In addition, the detection switch includes a wide barrel portion to be set within the switch housing chamber and a narrow straight portion ranging out from the outer circumference of the barrel portion and to be set within the groove opening. The barrel portion is formed to assume a width smaller than the opening width of the groove opening and the height of the detection switch is smaller than the depth of the switch mounting groove, allowing the detection switch to be inserted through the groove opening into the switch mounting groove. Before the detection switch inserted in the switch mounting groove is lifted via the retainer screw, a space is formed above the straight portion within the groove opening of the switch mounting groove so as to absorb elastic deformation of the holding arms occurring as the switch holder is inserted into the switch mounting groove and clearances to accommodate the engaging portions of the holding arms at the front ends thereof, are formed between the detection switch ranging over the barrel portion and the straight portion and the groove walls of the switch mounting groove.

The switch holder includes the pair of holding arms and a linking portion extending astride the detection switch to link the two holding arms to each other. The switch holder is allowed to undergo elastic deformation along a direction in which the distance between the two holding arms decreases and as the holding arms become elastically deformed, the switch holder can be inserted from above the detection switch through the groove opening into the switch mounting groove. The holding arms are formed so as to assume dimensions that allow the front ends of the holding arms to take up positions further toward the groove opening relative to the center of the switch housing chamber along the depthwise direction when the detection switch is locked via the switch holder. Thus, the engaging portions at the front ends of the holding arms are allowed to move into the clearances as the switch holder is inserted at the switch mounting groove.

In a preferred mode of the present invention, a left groove wall and a right groove wall of the switch mounting groove over an area constituting the switch housing chamber, are formed in a circular arc shape curving outward. In addition, it is desirable that at least part of the exterior of the barrel portion of the detection switch, which corresponds to the left and right groove walls of the switch housing chamber, be formed to achieve a circular arc shape and that the left and right holding arms of the switch holder include base portions ranging parallel to each other to face opposite each other and the engaging portions ranging out from the individual base portions so as to widen the dist between them. The engaging portions are formed to assume a circular arc shape.

It is desirable that the engaging portions of the switch holder according to the present invention each include an inner contact surface assuming a circular arc shape, which comes in contact with the outer circumference of the barrel portion of the detection switch, and an outer contact surface assuming a circular arc shape, which comes into contact with the groove wall of the switch housing chamber, with the length of the outer contact surface measured along the circumferential direction set smaller than the length of the inner contact surface measured along the circumferential direction.

According to the present invention, the switch holder can be inserted from above the detection switch already housed within the switch mounting groove through the groove opening of the switch mounting groove. As a result, the detection switch and the switch holder can be mounted with ease at a compact fluid pressure device with the switch mounting groove formed therein assuming a length less than the sum of the switch holder length and the detection switch length, as well as at a regular size fluid pressure device with the switch mounting groove assuming a length greater than the sum of the switch holder length and the detection switch length.

BEST MODE FOR CARRYING OUT THE INVENTION

FIGS. 1 through 6 show an embodiment of the switch mounting mechanism in a fluid pressure device according to the present invention. The fluid pressure device in the embodiment is a compact fluid pressure cylinder with a small operating stroke.

Figure 1:
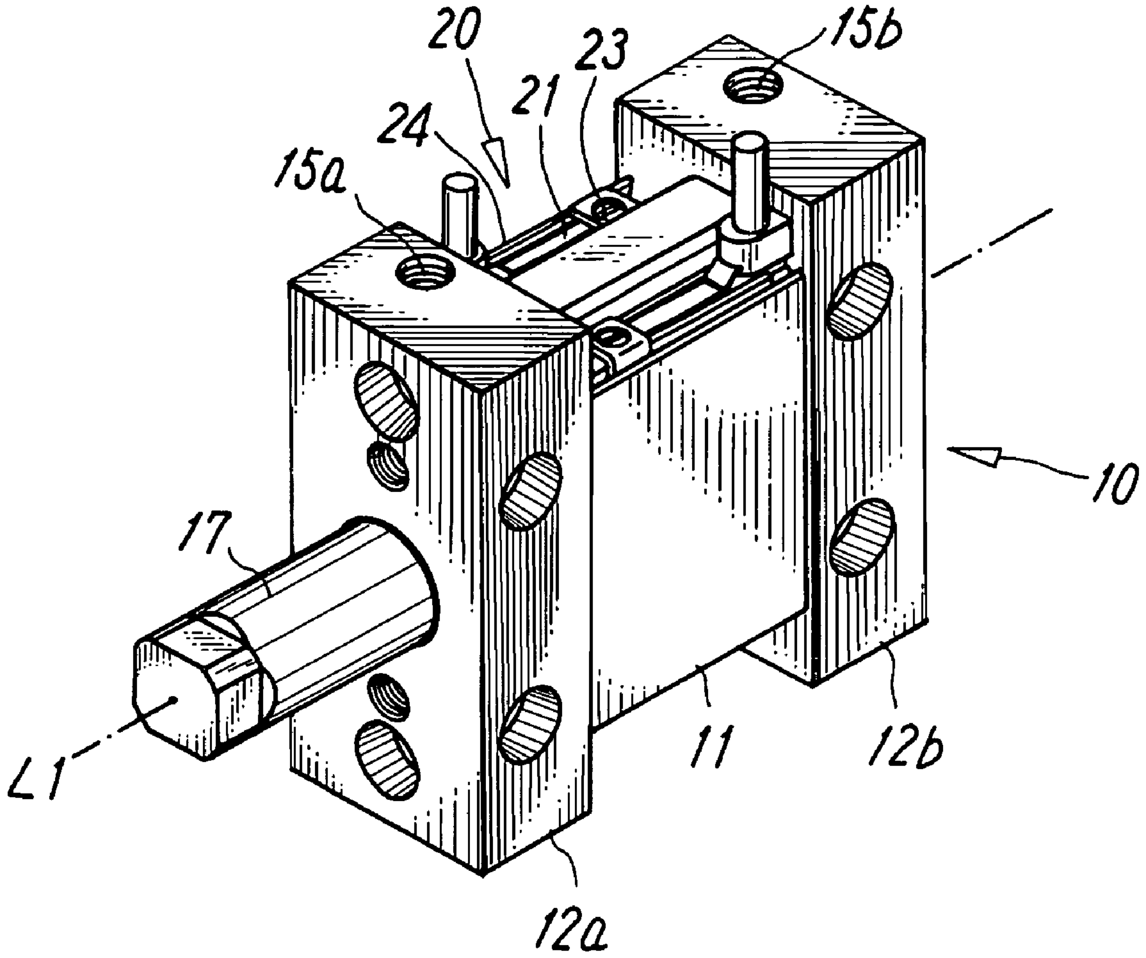
FIG. 1 is a perspective of an embodiment of the present invention.
Figure 2:
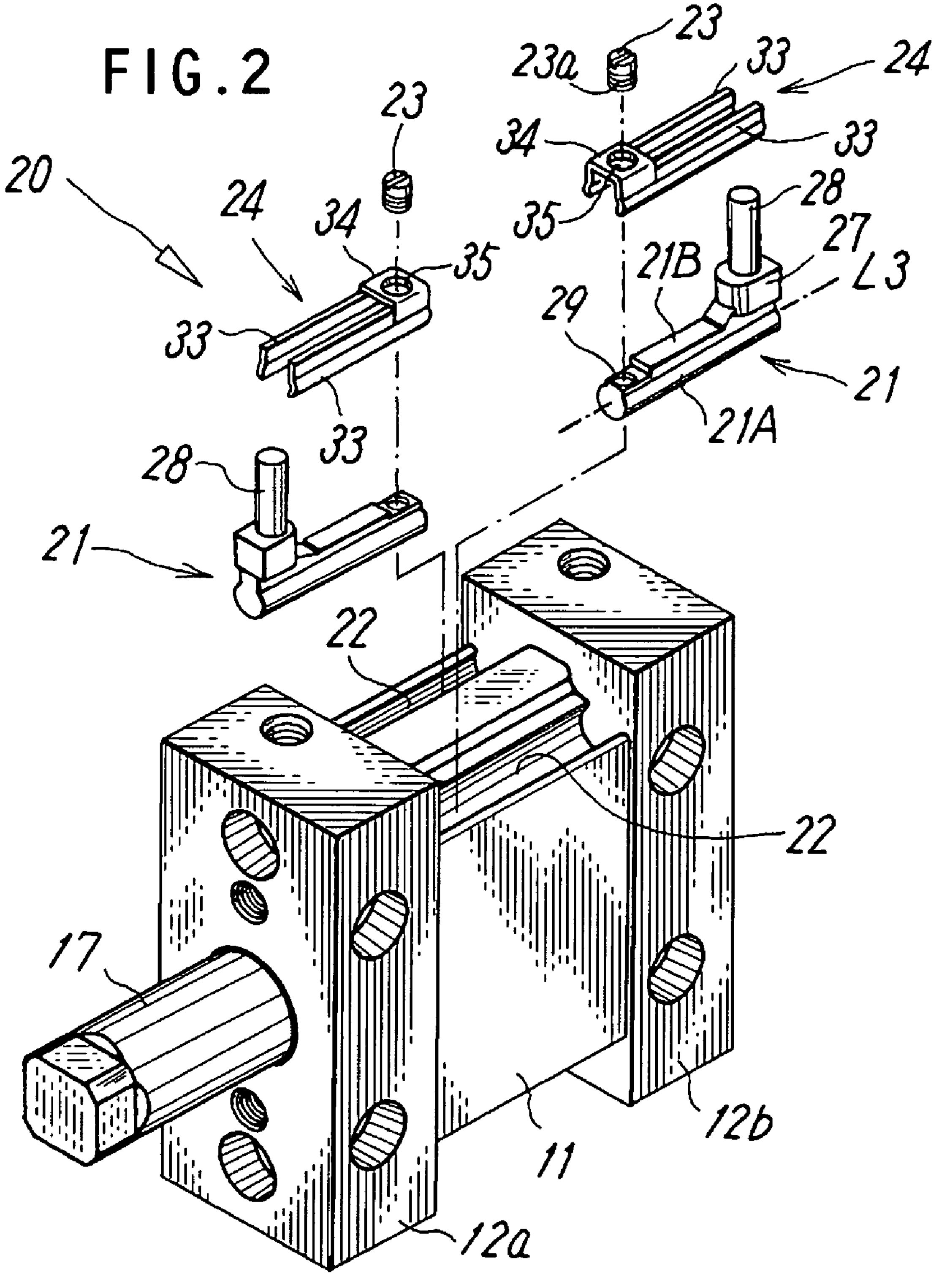
FIG. 2 is a perspective with the detection switches and the switch holders disengaged from the assembly shown in FIG. 1.
Figure 3:
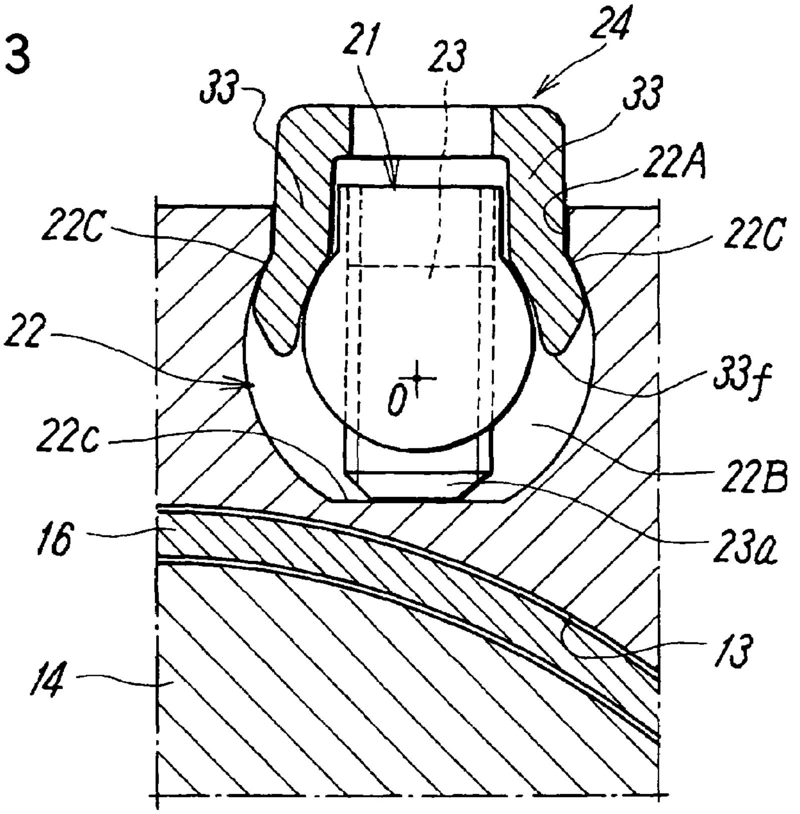
FIG. 3 is an enlarged sectional view of an essential portion of FIG. 1.

As FIGS. 1 through 3 clearly illustrate, the fluid pressure cylinder 10 includes a housing 11 with a substantially rectangular section and rectangular end plates 12*a* and 12*b* mounted at the two ends of the housing 11.

Inside the housing 11, a circular cylinder chamber 13 ranging along an axis L1 set at the center thereof is formed, and the two ends of the cylinder chamber 13 are closed off by the two end plates 12*a* and 12*b*. A piston 14, housed inside the cylinder chamber 13, is caused to move reciprocally along the axis L1 with the action of a pressure fluid such as air, delivered and discharged on the two sides of the piston 14 through ports 15*a* and 15*b*. In addition, a ring-shaped permanent magnet 16, which is a detection target detected in order to ascertain the operating position of the piston 14, is mounted over the outer circumference of the piston 14.

A base end of a rod 17, extending along the axis L1, is linked to the piston 14 and the front end of the rod 17, slidably passing through one of the end plates, i.e., the end plates 12*a*, while assuring a high level of airtightness, is exposed outside the housing 11.

A switch mounting mechanism 20 via which a detection switch 21 to be used to detect the permanent magnet 16 is mounted at the fluid pressure cylinder 10. The switch mounting mechanism 20 includes a switch mounting groove 22 formed at the housing 11, a detection switch 21 formed in a rod shape and installed at a detection position within the switch mounting groove 22, a retainer screw 23 mounted at the detection switch 21 so as to advance/retreat freely, which lifts the detection switch 21 off the groove bottom as it is tightened and its front end comes into contact with the groove bottom of the switch mounting groove 22 and a switch holder 24 disposed at the detection position inside the switch mounting groove 22 so as to hold the detection switch 21 from two sides via a pair of holding arms 33 and 33, made up with a left holding arm 33 and a right holding arm 33, which locks the detection switch 21 at the detection position as the holding arms 33 and 33 become engaged with the detection switch 21 lifted via the retainer screw 23 and the switch mounting groove 22.

Two switch mounting grooves 22 are formed at the upper surface of the housing 11. As FIGS. 3 through 6 clearly illustrate, the switch mounting grooves 22 each include a groove opening 22A that opens at the outer surface of the housing 11 and a switch housing chamber 22B located further into the groove relative to the groove opening 22A. The opening width Ha of the groove opening 22A is smaller than the chamber with Hb of the switch housing chamber 22B and keeper portions 22C to engage with the switch holder 24 is formed at the boundary of the groove opening 22A and the switch housing chamber 22B. The two switch mounting grooves 22 and 22 extend parallel to each other over the entire length of the housing 11 along the axis L1 and they are closed off by the end plates 12*a* and 12*b* at both ends thereof. The length of each switch mounting groove 22 is less than the sum of the length of the detection switch 21 and the length of the switch holder 24.

Left and right groove walls 22*a* of the groove opening 22A in the switch mounting groove 22, which face opposite each other, are each constituted with a flat surface ranging parallel to a groove centerline L2 extending through the center of the switch mounting groove 22 along the depthwise direction. The left and right groove walls thus range parallel to each other. Left and right groove walls 22*b* at the switch housing chamber 22B, on the other hand, are circular arc-shaped surfaces curving outward. A groove bottom 22*c* is a flat surface perpendicular to the groove centerline L2. However, the groove bottom 22*c* may be formed as a circular arc surface smoothly connecting with the left and right groove walls 22*b* at the switch housing chamber 22B.

The detection switch 21 includes a barrel portion 21A with a gently arced outer contour which is greater than half that of the groove and a straight portion 21B extending outward (upward) from a position equivalent to a chord of the barrel portion 21A. The barrel portion 21A is set within the switch housing chamber 22B at the switch mounting groove 22, whereas the straight portion 21B is set inside the groove opening 22A. The width Hd of the straight portion 21B is set smaller than the maximum width Hc of the barrel portion 21A.

At one end of the detection switch 21 along an axis L3, a lead wire connection portion 27 is formed at a position above the straight portion 21B and a lead wire 28 extends from the lead wire connection portion 27 along a direction perpendicular to the axis L3. In addition, at another end of the detection switch 21 along the axis L3, a screw mounting portion 29 is formed at a position above the straight portion 21B and the retainer screw 23 mentioned earlier is mounted at a screw hole formed at the screw mounting portion 29 so as to advance or retreat freely along the direction perpendicular to the axis L3. As the retainer screw 23 is tightened to set a front end portion 23*a* in contact with the groove bottom 22*c* of the switch mounting groove 22 and the retainer screw 23 is further turned in this state, the detection switch 21 becomes lifted off the groove bottom 22*c*, as shown in FIG. 3.

The maximum width Hc of the barrel portion 21A of the detection switch 21 is smaller than the opening width Ha of the groove opening 22A at the switch mounting groove 22 and thus, the detection switch 21 can be inserted through the groove opening 22A at any desired position, e.g., the detection position or another position, inside the switch mounting groove 22.

It is to be noted that while the part of the exterior of the barrel version 21A, which corresponds to the left and right groove walls 22*b* formed in the circular arc shape at the switch housing chamber 22B, at least, needs to assume a circular arc shape as well, the bottom of the barrel portion may be constituted with a flat surface.

Figure 4:
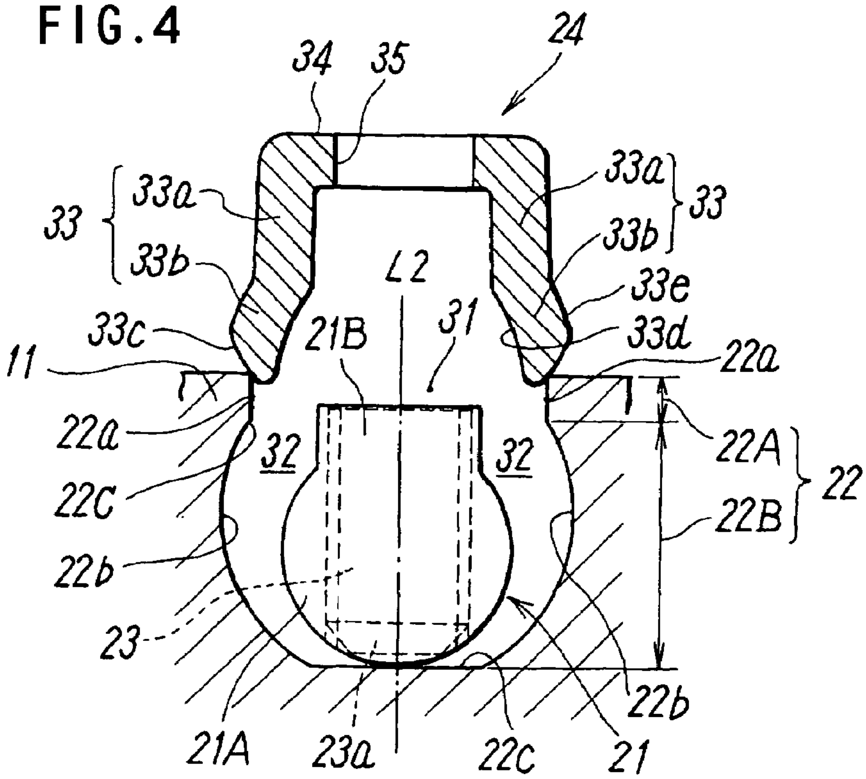
FIG. 4 is an enlarged sectional view of an essential portion of the mechanism, showing an initial stage of the switch holder mounting process.
Figure 5:
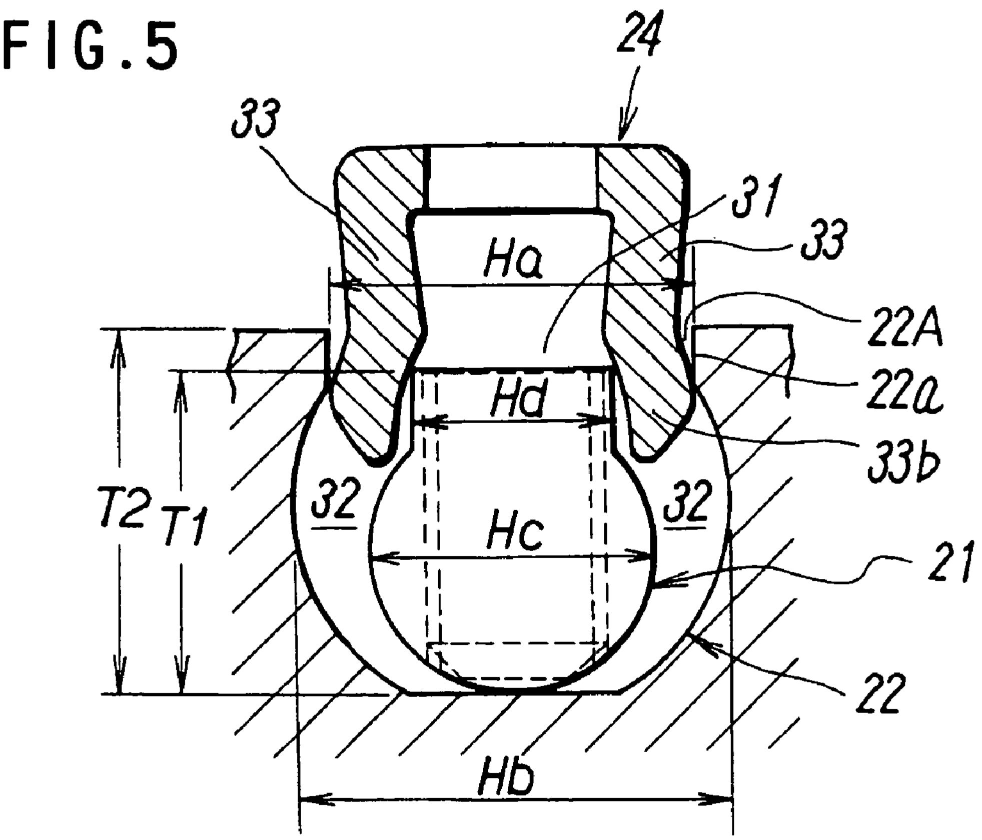
FIG. 5 is an enlarged sectional view of an essential portion of the mechanism, showing an intermediate stage of the switch holder mounting process.

The height T1 of the detection switch 21, i.e., the height T1 representing the sum of the heights of the barrel portion 21A and the straight portion 21B, is smaller than the depth T2 of the switch mounting groove 22. Thus, as the bottom end of the detection switch 21 housed within the switch mounting groove 22 is placed in contact with the groove bottom 22*c*, the upper surface of the straight portion 21B assumes a position lower than the outer surface of the housing 11, preferably a position close to the deep end (lower end) of the groove walls 22*a* of the groove opening 22A, thereby forming a space 31 at the groove opening 22A inside the switch mounting groove 22, as shown in FIG. 4. The space 31 is used to absorb the elastic deformation of the left and right holding arms 33 and 33 which become deformed inward as the switch holder 24 is pushed into the switch mounting groove 22 through the groove opening 22A, as shown in FIG. 5.

Since the height T1 of the detection switch 21 is smaller than the depth T2 of the switch mounting groove 22 and the maximum width Hc of the barrel portion 21A is smaller than the opening width Ha of the groove opening 22A, clearances 32, to accommodate the engaging portions 33*b* at the front ends of the pair of holding arms 33 and 33 of the switch holder 24 are formed between the left and right side surfaces of the detection switch 21 and the left and right groove walls 22*a* and 22*b* of the switch mounting groove 22 holding therein the detection switch 21.

The switch holder 24 includes the holding arms 33 and 33 extending along the outer side surfaces of the detection switch 21 over the length of the detection switch 21 and a flat linking portion 34 linking the upper ends of the holding arms 33 to each other. The linking portion 34, which partially connects the holding arms 33 and 33 to each other on one side along the length of the holding arms, is formed at a position so as to range astride the screw mounting portion 29 of the detection switch 21. An operating hole 35 through which the retainer screw 23 is turned is formed at the linking portion 34.

The pair of holding arms 33 and 33 and the linking portion 34 are formed as an integrated unit constituted of an elastic synthetic resin. Thus, as the switch holder 24 is pushed into the switch mounting groove 22 through the groove opening 22A, the holding arms 33 and 33 are allowed to undergo the process of elastic deformation along the direction in which the distance between them decreases.

The left and right holding arms 33 and 33 include base portions 33*a* ranging parallel to each other to face opposite each other and the engaging portions 33*b* extending from the individual base portions 33*a* toward the outside of the switch holder 24 to gradually increase the distance between them. The engaging portions 33*b* are formed in a circular arc shape and each includes an inner contact surface 33*d* with a circular arc shape to come into contact with the outer circumference of the barrel portion 21A of the detection switch 21 and an outer contact surface 33*e* with a circular arc shape to come into contact with the groove wall 22*b* of the switch housing chamber 22B. The length of the outer contact surface 33*e* measured along the circumferential direction is smaller than the length of the inner contact surface 33*d* measured along the circumferential direction.

In addition, at the front end of each engaging portion 33*b*, a guide surface 33*c* inclining along a specific direction so that it ranges closer to the inside of the switch holder 24 further toward the front tip is formed. As shown in FIGS. 4 and 5, the guide surfaces 33*c* come into contact with the edge of the groove opening 22A as the switch holder 24 is pushed into the switch mounting groove 22 and function as a guide via which it is ensured that the two holding arms 33 and 33 become elastically deformed along the direction in which their distance from each other decreases.

The width of the engaging portions 33*b* measured along the upright direction, i.e., the width measured along the depth T2 of the switch mounting groove 22, is relatively small so as to ensure that when the detection switch 21 is locked via the engaging portions 33*b* engaged with the keeper portions 22C of the switch mounting groove 22 and the detection switch 21, as shown in FIG. 3, the front tips 33*f* of the engaging portions 33*b* are set further toward the groove opening 22A relative to the center O of the switch housing chamber 22B assumed along the depthwise direction.

The detection switch 21 is mounted at the fluid pressure cylinder 10 via the switch mounting mechanism 20 structured as described above by first loosening the retainer screw 23 of the detection switch 21 to a position at which its front end 23*a* no longer projects out beyond the detection switch 21, as shown in FIG. 4. In this state, the detection switch 21 is inserted into the switch mounting groove 22 through the groove opening 22A and the bottom of the detection switch 21 is placed in contact with the groove bottom 22*c*. At this time, the space 31 for absorbing the elastic deformation of the two holding arms 33 and 33 of the switch holder 24 is formed above the straight portion 21B within the groove opening 22A of the switch mounting groove 22 and also, sufficiently large clearances 32, to accommodate the engaging portions 33*b* at the front ends of the holding arms 33, are formed between the left and right groove walls 22*a* and 22*b* of the switch mounting groove 22 and the left and right side surfaces of the detection switch 21.

Figure 6:
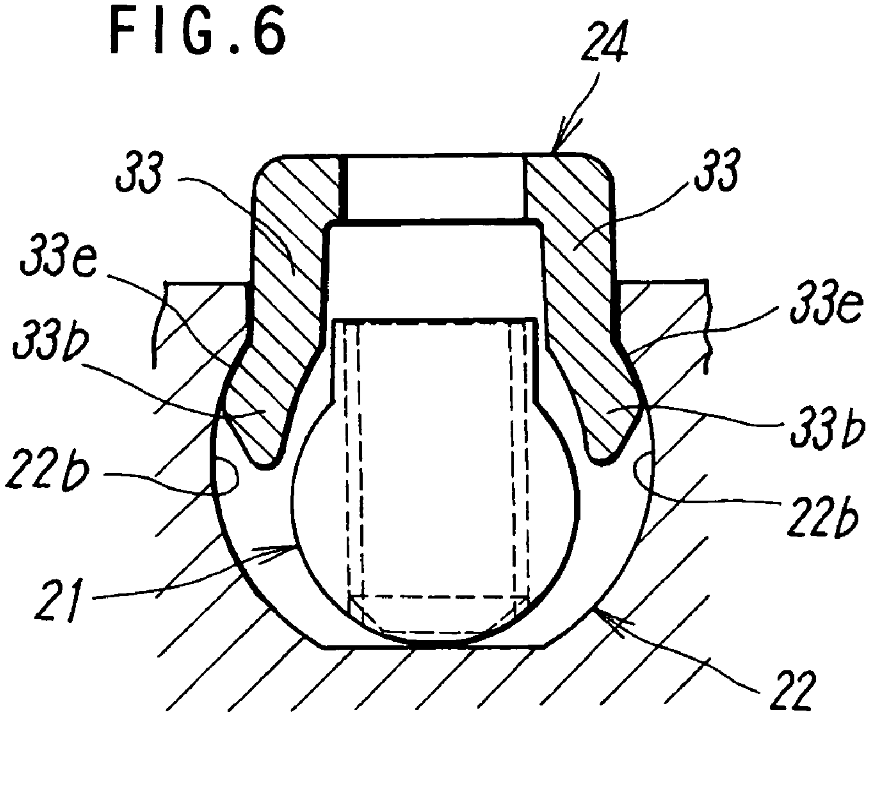
FIG. 6 is an enlarged sectional view of an essential portion of the mechanism, showing a final stage of the switch holder mounting process.
Figure 7:
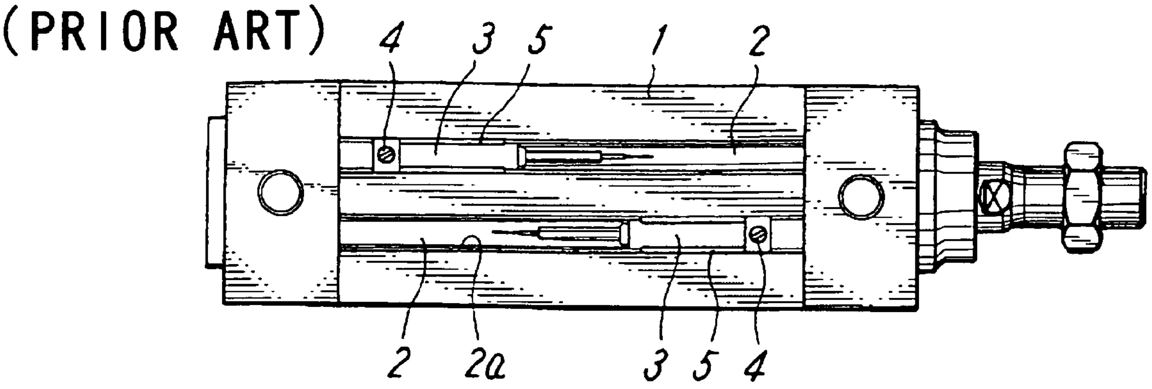
FIG.7 (PRIOR ART)
FIG. 7 is a perspective presenting an example of a switch mounting mechanism in the related art.
Figure 8:
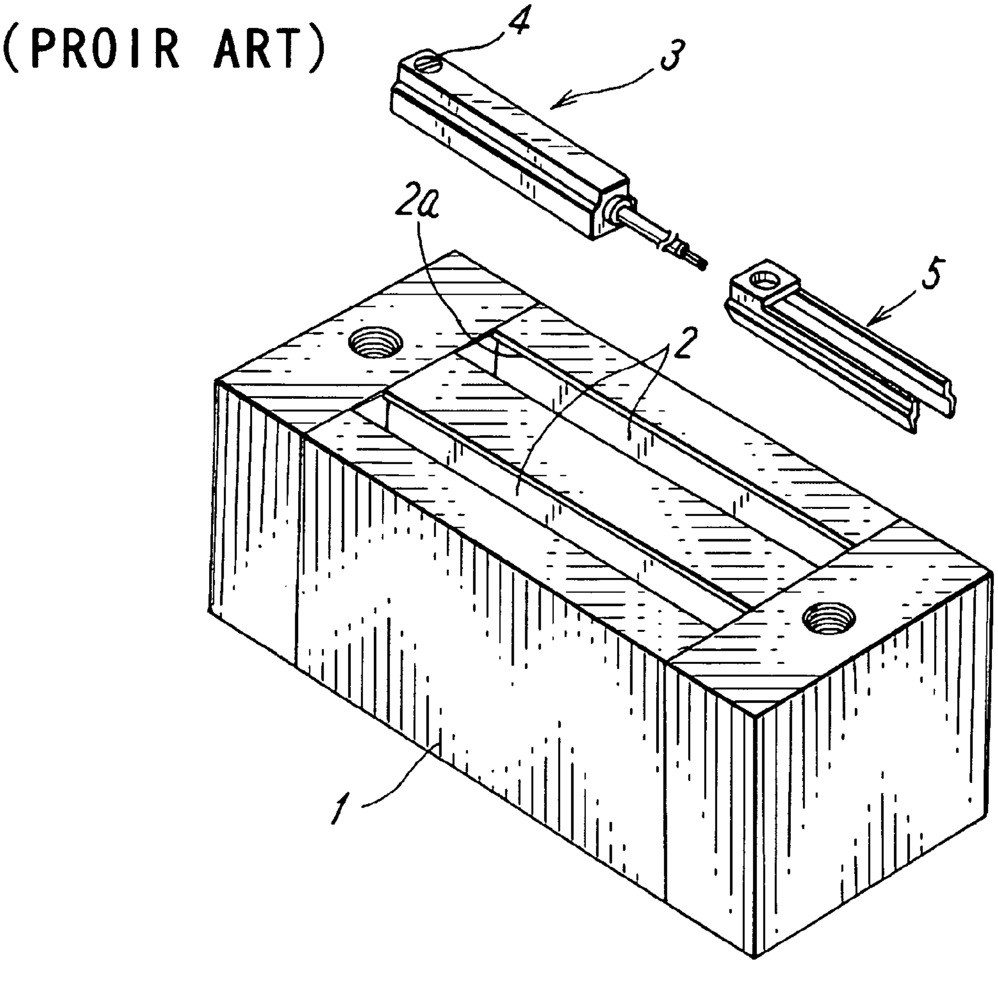
FIG. 8 is a perspective with the detection switch and the switch holder disengaged from the assembly shown in FIG. 7.
Figure 9:
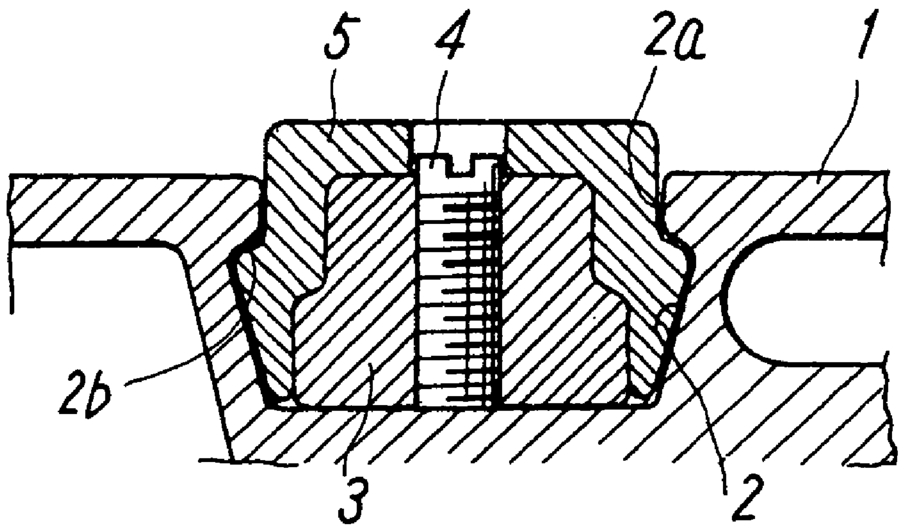
FIG.9(PRIOR ART)
FIG. 9 is an enlarged sectional view of an essential portion of FIG. 7.

Next, the switch holder 24 is inserted into the switch mounting groove 22 via the groove opening 22A from above the detection switch 21. The switch holder 24 is inserted as illustrated in FIG. 4, by placing the guide surfaces 33*c* at the front ends of the left and right holding arms 33 and 33 in contact with the opening edge of the groove opening 22A and then forcefully pressing in the switch holder 24 in the state. As a result, the two holding arms 33 and 33 advance forward along the groove walls 22*a* of the groove opening 22A as they undergo with the process of elastic deformation along the direction in which the distance between them decreases, as shown in FIG. 5, until the engaging portions 33*b* at the front ends slip into the clearances 32. Once the engaging portions 33*b* become completely housed inside the clearances 32, the two holding arms 33 and 33 regain their initial shape due to their resilience and the outer contact surfaces 33*e* contact the groove walls 22*b* of the switch housing chamber 22B as shown in FIG. 6.

Next, the switch holder 24 and the detection switch 21 are made to slide relative to each other in order to adjust their positions relative to each other so as to align the operating hole 35 and the retainer screw 23. Then, the switch holder 24 and the detection switch 21 are made to slide together in the switch mounting groove 22 until they reach a predetermined detection position. The retainer screw 23 is tightened at the detection position and as the retainer screw 23 is further turned with the front end 23*a* thereof pressed against the groove bottom 22*c* of the switch mounting groove 22, the detection switch 21 becomes lifted off the groove bottom 22*c*. As a result, the detection switch 21 is set in contact with the engaging portions 33*b* of the holding arms 33 at the switch holder 24, as shown in FIG. 3, thereby pressing the engaging portions 33*b* against the groove walls 22*b* of the switch mounting groove 22 and holding them in place at the keeper portions 22C. The detection switch 21 thus becomes locked at the detection portion.

While the detection switch 21 is mounted at each of the two switch mounting grooves 22 and 22, the detection switch 21 mounted at one of the switch mounting grooves 22 is used to detect the position of the forward stroke end of the piston 14, whereas the detection switch 21 mounted at the other switch mounting groove 22 is used to detect the position of the reverse stroke end of the piston 14. Accordingly, one set of a detection switch 21 and a switch holder 24 and the other set of a detection switch 21 and a switch holder 24 should be mounted with their orientations reversed from each other at positions toward opposite ends in two switch mounting grooves 22 and 22.

The switch mounting mechanism 20 allows each switch holder 24 to be inserted through the groove opening 22A of the switch mounting groove 22 from above the detection switch 21 already housed within the switch mounting groove 22. Thus, the detection switch 21 and the switch holder 24 can be mounted at a predetermined detection position with ease even at a compact fluid pressure cylinder 10 with the switch mounting groove 22 formed thereat assuming a length smaller than the sum of the length of the switch holder 24 and the length of the detection switch 21.

It will be obvious that the switch mounting mechanism allows the detection switch and the switch holder to be mounted with great ease at a regular size fluid pressure cylinder with the switch mounting groove formed thereat assuming a length greater than the sum of the length of the switch holder and the length of the detection switch.

It is to be noted that while an explanation is given above in reference to an embodiment in which the present invention is adopted in a fluid pressure device constituted with a fluid pressure cylinder, the present invention is not limited to this example and it can be adopted equally effectively in another type of fluid pressure device such as an electromagnetic valve.

The invention claimed is:

1. A switch mounting mechanism, comprising:

a switch mounting groove formed at a housing of a fluid pressure device;

a rod-shaped detection switch installed at a detection position within said switch mounting groove;

a retainer screw mounted at said detection switch, which lifts up said detection switch as said retainer screw is tightened; and a switch holder disposed inside said switch mounting groove so as to hold said detection switch from two sides with a pair of holding arms, made up with a left holding arm and a right holding arm that become engaged with said detection switch and said switch mounting groove to lock said detection switch at said detection position, as said retainer screw is tightened and said detection switch is lifted;

said switch mounting groove includes a groove opening that opens at an outer surface of said housing and a switch housing chamber located further into said groove relative to said groove opening, with said groove opening formed so that said groove opening opens over a width smaller than the chamber width of said switch housing chamber and a keeper portion to engage with said switch holder, formed at the boundary between said groove opening and said switch housing chamber;

said detection switch includes a wide barrel portion to be set within said switch housing chamber and a narrow straight portion ranging out from the outer circumference of said barrel portion to be set within said groove opening, said barrel portion is formed to assume a width smaller than the opening width of said groove opening, the height of said detection switch is smaller than the depth of said switch mounting groove, allowing said detection switch to be inserted through said groove opening into said switch mounting groove, and before said detection switch inserted in said switch mounting groove is lifted via said retainer screw, a space is formed above said straight portion within said groove opening of said switch mounting groove so as to absorb elastic deformation of said holding arms occurring as said switch holder is inserted into said switch mounting groove and clearances at which said engaging portions of said holding arms at the front ends thereof can be accommodated, are formed between said detection switch ranging over said barrel portion and said straight portion and groove walls of said switch mounting groove; and said switch holder includes said pair of holding arms and a linking portion extending astride said detection switch to link said holding arms to each other, said switch holder is allowed to undergo elastic deformation along a direction in which the distance between said holding arms decreases, as said holding arms become elastically deformed, said switch holder can be inserted from above said detection switch through said groove opening into said switch mounting groove, and said holding arms are formed so as to assume dimensions that allow the front ends of said holding arms to take up positions further toward said groove opening relative to the center of said switch housing chamber along the depthwise direction when said detection switch is locked via said switch holder, thereby allowing said engaging portions at the front ends of said holding arms to move into said clearances as said switch holder is inserted at said switch mounting groove.

2. A switch mounting mechanism according to claim 1, wherein:

a left groove wall and a right groove wall of said switch mounting groove, over an area constituting said switch housing chamber, are formed in a circular arc shape curving outward, at least part of the exterior of said barrel portion of said detection switch, which corresponds to said left and right groove walls of said switch housing chamber, is formed to achieve a circular arc shape, said left and right holding arms of said switch holder include base portions ranging parallel to each other to face opposite each other and said engaging portions ranging out from the individual base portions so as to widen the distance from each other, said engaging portions are formed in a circular arc shape.

3. A switch mounting mechanism according to claim 2, wherein:

said engaging portions of said switch holder each include an inner contact surface assuming a circular arc shape, which comes in contact with the outer circumference of said barrel portion of said detection switch, and an outer contact surface assuming a circular arc shape, which comes into contact with a groove wall of said switch housing chamber, with the length of said outer contact surface measured along the circumferential direction set smaller than the length of said inner contact surface measured along the circumferential direction.

* * * * *